US008837546B1

(12) United States Patent
Raring et al.

(10) Patent No.: US 8,837,546 B1
(45) Date of Patent: Sep. 16, 2014

(54) GALLIUM NITRIDE BASED LASER DAZZLING DEVICE AND METHOD

(71) Applicant: Soraa, Inc., Fremont, CA (US)

(72) Inventors: James W. Raring, Fremont, CA (US); Paul Rudy, Fremont, CA (US)

(73) Assignee: Soraa Laser Diode, Inc., Goleta, CA (US)

(*) Notice: Subject to any disclaimer, the term of this patent is extended or adjusted under 35 U.S.C. 154(b) by 0 days.

(21) Appl. No.: 13/937,981

(22) Filed: Jul. 9, 2013

Related U.S. Application Data

(63) Continuation of application No. 12/787,343, filed on May 25, 2010, now Pat. No. 8,509,275.

(60) Provisional application No. 61/182,104, filed on May 29, 2009.

(51) Int. Cl.
H01S 5/00 (2006.01)

(52) U.S. Cl.
USPC .......................................... 372/43.01

(58) Field of Classification Search
USPC .......................................... 372/43.01–50.23
See application file for complete search history.

(56) References Cited

U.S. PATENT DOCUMENTS

| 4,341,592 | A | 7/1982 | Shortes et al. |
| 4,860,687 | A | 8/1989 | Frijlink |
| 4,911,102 | A | 3/1990 | Manabe et al. |
| 5,331,654 | A | 7/1994 | Jewell et al. |
| 5,334,277 | A | 8/1994 | Nakamura |
| 5,366,953 | A | 11/1994 | Char et al. |
| 5,527,417 | A | 6/1996 | Lida et al. |
| 5,607,899 | A | 3/1997 | Yoshida et al. |
| 5,632,812 | A | 5/1997 | Hirabayashi |
| 5,647,945 | A | 7/1997 | Matsuse et al. |
| 5,696,389 | A | 12/1997 | Ishikawa et al. |
| 5,821,555 | A | 10/1998 | Saito et al. |
| 5,888,907 | A | 3/1999 | Tomoyasu et al. |
| 5,926,493 | A | 7/1999 | O'Brien et al. |
| 5,951,923 | A | 9/1999 | Rorie et al. |
| 6,069,394 | A | 5/2000 | Hashimoto et al. |

(Continued)

FOREIGN PATENT DOCUMENTS

| CN | 101009347 | 3/1987 |
| CN | 1538534 | 10/2004 |

(Continued)

OTHER PUBLICATIONS

Communication from the Japanese Patent Office re 2012-011589 dated Jul. 4, 2013, 15 pages.

(Continued)

Primary Examiner — Douglas W Owens
Assistant Examiner — Jianzi Chen
(74) Attorney, Agent, or Firm — Kilpatrick Townsend & Stockton LLP

(57) ABSTRACT

A laser dazzler device and method. More specifically, embodiments of the present invention provide laser dazzling devices power by one or more green laser diodes characterized by a wavelength of about 500 nm to 540 nm. In various embodiments, laser dazzling devices according to the present invention include non-polar and/or semi-polar green laser diodes. In a specific embodiment, a single laser dazzling device includes a plurality of green laser diodes. There are other embodiments as well.

29 Claims, 6 Drawing Sheets

(56) References Cited

U.S. PATENT DOCUMENTS

| | | |
|---|---|---|
| 6,072,197 A | 6/2000 | Horino et al. |
| 6,129,900 A | 10/2000 | Satoh et al. |
| 6,147,953 A | 11/2000 | Duncan |
| 6,153,010 A | 11/2000 | Kiyoku et al. |
| 6,195,381 B1 | 2/2001 | Botez et al. |
| 6,239,454 B1 | 5/2001 | Glew et al. |
| 6,273,948 B1 | 8/2001 | Porowski et al. |
| 6,379,985 B1 | 4/2002 | Cervantes et al. |
| 6,398,867 B1 | 6/2002 | D'Evelyn et al. |
| 6,406,540 B1 | 6/2002 | Harris et al. |
| 6,451,157 B1 | 9/2002 | Hubacek |
| 6,489,636 B1 | 12/2002 | Goetz et al. |
| 6,586,762 B2 | 7/2003 | Kozaki |
| 6,596,079 B1 | 7/2003 | Vaudo et al. |
| 6,635,904 B2 | 10/2003 | Goetz et al. |
| 6,639,925 B2 | 10/2003 | Niwa et al. |
| 6,656,615 B2 | 12/2003 | Dwilinski et al. |
| 6,680,959 B2 | 1/2004 | Tanabe et al. |
| 6,686,608 B1 | 2/2004 | Takahira |
| 6,734,461 B1 | 5/2004 | Shiomi et al. |
| 6,755,932 B2 | 6/2004 | Masuda et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,861,130 B2 | 3/2005 | D'Evelyn et al. |
| 6,920,166 B2 | 7/2005 | Akasaka et al. |
| 7,001,577 B2 | 2/2006 | Zimmerman et al. |
| 7,009,199 B2 | 3/2006 | Hall |
| 7,019,325 B2 | 3/2006 | Li et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,128,849 B2 | 10/2006 | Setlur et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,220,324 B2 | 5/2007 | Baker et al. |
| 7,252,712 B2 | 8/2007 | Dwilinski et al. |
| 7,303,630 B2 | 12/2007 | Motoki et al. |
| 7,312,156 B2 | 12/2007 | Granneman et al. |
| 7,316,746 B2 | 1/2008 | D'Evelyn et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,368,015 B2 | 5/2008 | D'Evelyn et al. |
| 7,381,391 B2 | 6/2008 | Spencer et al. |
| 7,390,359 B2 | 6/2008 | Miyanaga et al. |
| 7,420,261 B2 | 9/2008 | Dwilinski et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,569,206 B2 | 8/2009 | Spencer et al. |
| 7,598,104 B2 | 10/2009 | Teng et al. |
| 7,625,446 B2 | 12/2009 | D'Evelyn et al. |
| 7,642,122 B2 | 1/2010 | Tysoe et al. |
| 7,691,658 B2 | 4/2010 | Kaeding et al. |
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B2 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,179 B1 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,351,478 B2 | 1/2013 | Raring et al. |
| 8,354,679 B1 | 1/2013 | D'Evelyn et al. |
| 8,355,418 B2 | 1/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,509,275 B1 | 8/2013 | Raring et al. |
| 2001/0011935 A1 | 8/2001 | Lee et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2002/0189532 A1 | 12/2002 | Motoki et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |

(56) References Cited

U.S. PATENT DOCUMENTS

| | | |
|---|---|---|
| 2005/0072986 A1 | 4/2005 | Sasaoka |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0168564 A1 | 8/2005 | Kawaguchi et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0256559 A1 | 11/2006 | Bitar |
| 2006/0288928 A1 | 12/2006 | Eom et al. |
| 2007/0057337 A1 | 3/2007 | Kano et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0217462 A1 | 9/2007 | Yamasaki |
| 2007/0218703 A1 | 9/2007 | Kaeding et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 * | 2/2008 | Milshtein et al. ............ 136/252 |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0193363 A1 | 8/2008 | Tsuji |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0092536 A1 | 4/2009 | Kawabata et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0218593 A1 | 9/2009 | Kamikawa et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0075175 A1 | 3/2010 | Poblenz et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140745 A1 | 6/2010 | Khan et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |

(56) References Cited

U.S. PATENT DOCUMENTS

| | | | |
|---|---|---|---|
| 2011/0031508 A1 | 2/2011 | Hamaguchi et al. | |
| 2011/0056429 A1 | 3/2011 | Raring et al. | |
| 2011/0057167 A1 | 3/2011 | Ueno et al. | |
| 2011/0062415 A1 | 3/2011 | Ohta et al. | |
| 2011/0064100 A1 | 3/2011 | Raring et al. | |
| 2011/0064101 A1 | 3/2011 | Raring et al. | |
| 2011/0064102 A1 | 3/2011 | Raring et al. | |
| 2011/0064103 A1 | 3/2011 | Ohta et al. | |
| 2011/0073888 A1* | 3/2011 | Ueno et al. | 257/94 |
| 2011/0075694 A1 | 3/2011 | Yoshizumi et al. | |
| 2011/0100291 A1 | 5/2011 | D'Evelyn | |
| 2011/0103418 A1 | 5/2011 | Hardy et al. | |
| 2011/0129669 A1 | 6/2011 | Fujito et al. | |
| 2011/0150020 A1* | 6/2011 | Haase et al. | 372/45.012 |
| 2011/0164637 A1 | 7/2011 | Yoshizumi et al. | |
| 2011/0180781 A1 | 7/2011 | Raring et al. | |
| 2011/0183498 A1 | 7/2011 | D'Evelyn | |
| 2011/0186874 A1 | 8/2011 | Shum | |
| 2011/0186887 A1 | 8/2011 | Trottier et al. | |
| 2011/0216795 A1 | 9/2011 | Hsu et al. | |
| 2011/0220912 A1 | 9/2011 | D'Evelyn | |
| 2011/0247556 A1 | 10/2011 | Raring et al. | |
| 2011/0256693 A1 | 10/2011 | D'Evelyn et al. | |
| 2011/0262773 A1 | 10/2011 | Poblenz et al. | |
| 2011/0281422 A1 | 11/2011 | Wang et al. | |
| 2011/0286484 A1 | 11/2011 | Raring et al. | |
| 2012/0000415 A1 | 1/2012 | D'Evelyn et al. | |
| 2012/0073494 A1 | 3/2012 | D'Evelyn | |
| 2012/0091465 A1 | 4/2012 | Krames et al. | |
| 2012/0104359 A1 | 5/2012 | Felker et al. | |
| 2012/0118223 A1 | 5/2012 | D'Evelyn | |
| 2012/0119218 A1 | 5/2012 | Su | |
| 2012/0137966 A1 | 6/2012 | D'Evelyn et al. | |
| 2012/0178198 A1 | 7/2012 | Raring et al. | |
| 2012/0187371 A1 | 7/2012 | Raring et al. | |
| 2012/0199952 A1 | 8/2012 | D'Evelyn et al. | |
| 2012/0314398 A1 | 12/2012 | Raring et al. | |
| 2013/0016750 A1 | 1/2013 | Raring et al. | |
| 2013/0022064 A1 | 1/2013 | Raring et al. | |
| 2013/0044782 A1 | 2/2013 | Raring | |
| 2013/0064261 A1 | 3/2013 | Sharma et al. | |
| 2013/0119401 A1 | 5/2013 | D'Evelyn et al. | |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 1171692 | 4/2008 |
| JP | 3-287770 | 12/1991 |
| JP | 07-162081 | 6/1995 |
| JP | 2002-009402 | 1/2002 |
| JP | 2002-185082 | 6/2002 |
| JP | 2004-503923 | 2/2004 |
| JP | 2004-152841 | 5/2004 |
| JP | 2004-186527 | 7/2004 |
| JP | 2005-289797 | 10/2005 |
| JP | 2006-091285 | 4/2006 |
| JP | 2006-120923 | 5/2006 |
| JP | 2007-173467 A | 7/2007 |
| JP | 2007-529910 | 10/2007 |
| JP | 2007-068398 | 4/2008 |
| JP | 2008-311640 | 12/2008 |
| JP | 2009-021506 | 1/2009 |
| JP | 2009-158893 | 7/2009 |
| JP | 2009-170708 | 7/2009 |
| WO | 2006/057463 | 1/2006 |
| WO | 2007/004495 | 11/2007 |
| WO | 2008-041521 A1 | 4/2008 |
| WO | 2010/068916 | 6/2010 |
| WO | WO 2010/120819 | 10/2010 |
| WO | 2012/016033 | 2/2012 |

OTHER PUBLICATIONS

USPTO Notice of Allowance for U.S. Appl. No. 12/789,303 dated Dec. 21, 2012, 5 pages.

USPTO Notice of Allowance for U.S. Appl. No. 13/853,694 dated Sep. 3, 2013, 8 pages.

Abare "Cleaved and Etched Facet Nitride Laser Diodes," IEEE Journal of Selected Topics in Quantum Electronics, vol. 4, No. 3, pp. 505-509 (May 1998).

Aoki et al., InGaAs/InGaAsP MQW Electroabsorption Modulator Integrated with a DFB Laser Fabricated by Band-Gap Energy Control Selective Area MOCVD, 1993, IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN-GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Franssilla, Tools for CVD and Epitaxy, Introduction to Microfabrication, 2004, pp. 329-336.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1011106-3.

Founta et al., 'Anisotropic Morphology Of Nonpolar a-Plane GaN Quantum Dots And Quantum Wells,' Journal of Applied Physics, vol. 102, vol. 7, 2007, pp. 074304-1-074304-6.

Gardner et al. "Blue-emitting InGaN-GaN double-heterostructure light-emitting diodes reaching maximum quantum efficiency above 200 A/cm2", Applied Physics Letters 91, 243506 (2007).

hap://techon.nikkeibp.cojp/english/NEWS_EN/20080122/146009. Jan. 2008.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physica Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

(56) References Cited

OTHER PUBLICATIONS

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,", Journal of Applied Physics vol. 91, No. 12, pp. 9904-9908 (Jun. 2002).

Purvis, "Changing the Crystal Face of Gallium Nitride." The Advance Semiconductor Magazine, vol. 18, No. 8, Nov. 2005.

Romanov "Strain-induced polarization in wurtzite III-nitride semipolar layers," Journal of Applied Physics 100, pp. 023522-1 through 023522-10 (Jul. 25, 2006).

Sato et al., "High Power and High Efficiency Green Light Emitting Diode on free-Standing Semipolar (1122) Bulk GaN Substrate," 2007. Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Schoedl "Facet degradation of GaN heterostructure laser diodes," Journal of Applied Physics vol. 97, issue 12, pp. 123102-1 to 123102-8 (2005).

Shchekin et al., "High Performance Thin-film Flip-Chip InGaN-GaN Light-emitting Diodes," 2006, Applied Physics Letter, vol. 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Tyagi et al., Semipolar (1011) InGaN/GaN Laser Diodes on Bulk GaN Substrates, Japanese Journal of Applied Physics, vol. 46, No. 19, 2007, pp. L444-L445.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009).

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Choi et al., 2.51 microcavity InGaN light-emitting diodes fabricated by a selective dry-etch thinning process, Applied Physics Letters, 2007, 91(6), 061120.

Fukuda et al., 'Prospects for the Ammonothermal Growth Of Large GaN Crystal,' Journal of Crystal Growth, vol. 305, 2007, pp. 304-310.

Lide et al., Thermal Conductivity Of Ceramics And Other Insulating Materials, CRC Handbook of Chemistry and Physics, 91st Edition, 2010-2011, pp. 12-203 and 12-204.

http://www.matbase.com/material/non-ferrous-metals/other/molybdenum/properties, Data Table for: Non-Ferrous Metals: Other Metals: Molybdenum, Mar. 28, 2011, pp. 1.

Pattison et al., Gallium Nitride Based Microcavity Light Emitting Diodes With 2? Effective Cavity Thickness, Applied Physics Letters, vol. 90, Issue 3, 031111 (2007) 3 pg.

Sarva et al., Dynamic Compressive Strength Of Silicon Carbide Under Uniaxial Compression,' Material Sciences and Engineering, vol. A317, 2001, pp. 140-144.

Weisbuch et al., Recent results and latest views on microcavity LEDs Light-Emitting Diodes: Research, Manufacturing, and Applications VIII, ed. By S.A. Stockman et al., Proc. SPIE, vol. 5366, pp. 1-19 (2004).

Altoukhov et al., High reflectivity airgap distributed Bragg reflectors realized by wet etching of AlInN sacrificial layers, Applied Physics Letters, vol. 95, 2009, pp. 191102-1-3.

Callahan et al., Synthesis and Growth of Gallium Nitride by the Chemical Vapor Reaction Process (CVRP), MRS Internet Journal Nitride Semiconductor Research, vol. 4, No. 10, 1999, pp. 1-6.

Dorsaz et al., Selective oxidation of AlInN Layers for current confinement III-nitride devices', Applied Physics Letters, vol. 87, 2005, pp.

Ehrentraut et al., 'The ammonothermal crystal growth of gallium nitride-A technique on the up rise, Proceedings IEEE, 2010, 98(7), pp.1316-1323.

Fang, Deep centers in semi-insulating Fe-doped native GaN substrates grown by hydride vapour phase epitaxy, Physica Status Solidi, vol. 5, No. 6, 2008, pp. 1508-1511.

Fujito et al., Development of bulk GaN crystals and nonpolar/semipolar substrates by HVPE', MRS Bulletin, 2009, 34, 5, pp. 313-317.

Gladkov et al., Effect of Fe doping on optical properties of freestanding semi-insulating HVPE GaN:Fe, Journal of Crystal Growth, 312,2010, pp.1205-1209.

Grzegory, High pressure growth of bulk GaN from Solutions in gallium', Journal of Physics Condensed Matter, vol. 13, 2001, pp. 6875-6892.

Moutanabbir, 'Bulk GaN Ion Cleaving', Journal of Electronic Materials, vol. 39, 2010, pp. 482-488.

Oshima et al., Thermal and Optical Properties of Bulk GaN Crystals Fabricated Through Hydride Vapor Phase Epitaxy With Void-Assisted Separation', Journal of Applied Physics, vol. 98, No. 10, 2005, pp. 103509-1-103509-4.

(56) References Cited

OTHER PUBLICATIONS

Porowski, High Resistivity GaN Single Crystalline Substrates, Acta Physica Polonica A, vol. 92, No. 5, 1997, pp. 958-962.

Porowski, Near Defect Free GaN Substrates', Journal ofNitride Semiconductor, 1999, pp. 1-11.

Sharma et al., Vertically oriented GaN-based air-gap distributed Bragg reflector structure fabricated using band-gap-selective photoelectrochemical etching', Applied Physics Letters, vol. 87, 2005, pp. 051107.

Tyagi et al., Partial Strain relaxation via misfit dislocation generation at heterointerfaces in (Al,In)GaN epitaxial layers grown on semipolar (1122) GaN free standing substrates, Applied Physics Letters 95, (2009) pp. 251905.

Wang et al., Ammonothermal Growth Of GaN Crystals in Alkaline Solutions', Journal of Crystal Growth, vol. 287, 2006, pp. 376-380.

International Search Report of PCT Application No. PCT/US2009/047107, dated Sep. 29, 2009, 4 pages.

International Search Report of PCT Application No. PCT/US2009/046786, dated May 13, 2010, 2 pages.

International Search Report of PCT Application No. PCT/US2009/52611, dated Sep. 29, 2009, 3 pages.

International Search Report & Written Opinion of PCT Application No. PCT/US2010/030939, dated Jun. 16,2010, 9 pages.

International Search Report & Written Opinion of PCT Application No. PCT/US2010/049172, dated Nov. 17, 2010, 7 pages.

International Search Report of PCT Application No. PCT/US2011/037792, dated Sep. 8, 2011, 2 pages.

International Search Report of PCT Application No. PCT/US2009/067745, dated Feb. 5, 2010, 2 pages.

USPTO Notice of Allowance for U.S. Appl. No. 12/502,058 dated Jul. 19, 2012.

USPTO Office Action for U.S. Appl. No. 12/749,466 dated Jul. 3, 2012.

USPTO Notice of Allowance for U.S. Appl. No. 12/749,476 dated Jun. 26, 2012.

USPTO Office Action for U.S. Appl. No. 12/759,273 dated Jun. 26, 2012.

USPTO Notice of Allowance for U.S. Appl. No. 12/762,271 dated Aug. 8, 2012.

USPTO Notice of Allowance for U.S. Appl. No. 12/880,803 dated Jul. 18, 2012.

USPTO Office Action for U.S. Appl. No. 12/883,093 dated Aug. 3, 2012.

USPTO Office Action for U.S. Appl. No. 12/884,993 dated Aug. 2, 2012.

USPTO Office Action for U.S. Appl. No. 12/995,946 dated Mar. 28, 2012.

USPTO Office Action for U.S. Appl. No. 13/046,565 dated Jul. 19, 2012.

USPTO Office Action for U.S. Appl. No. 12/484,924 dated Oct. 31, 2011.

USPTO Office Action for U.S. Appl. No. 12/497,289 dated Feb. 2, 2012.

USPTO Office Action for U.S. Appl. No. 12/749,466 dated Feb. 3, 2012.

USPTO Office Action for U.S. Appl. No. 12/759,273 dated Nov. 21, 2011.

USPTO Office Action for U.S. Appl. No. 12/762,269 dated Oct. 12, 2011.

USPTO Office Action for U.S. Appl. No. 12/762,271 dated Dec. 23, 2011.

USPTO Notice of Allowance for U.S. Appl. No. 12/762,278 dated Nov. 7, 2011.

USPTO Office Action for U.S. Appl. No. 12/778,718 dated Nov. 25, 2011.

USPTO Office Action for U.S. Appl. No. 12/573,820 dated Oct. 11, 2011.

USPTO Office Action for U.S. Appl. No. 13/046,565 dated Nov. 7, 2011.

USPTO Office Action for U.S. Appl. No. 13/046,565 dated Feb. 2, 2012.

USPTO Office Action for U.S. Appl. No. 12/481,543 dated Jun. 27, 2011.

USPTO Office Action for U.S. Appl. No. 12/482,440 dated Feb. 23, 2011.

USPTO Office Action for U.S. Appl. No. 12/482,440 dated Aug. 12, 2011.

USPTO Office Action for U.S. Appl. No. 12/484,924 dated Apr. 14, 2011.

USPTO Office Action for U.S. Appl. No. 12/491,169 dated Oct. 22, 2010.

USPTO Office Action for U.S. Appl. No. 12/491,169 dated May 11, 2011.

USPTO Notice of Allowance for U.S. Appl. No. 12/497,289 dated May 22, 2012.

USPTO Office Action for U.S. Appl. No. 12/502,058 dated Dec. 8, 2010.

USPTO Office Action for U.S. Appl. No. 12/502,058 dated Aug. 19, 2011.

USPTO Notice of Allowance for U.S. Appl. No. 12/502,058 dated Apr. 16, 2012.

USPTO Office Action for U.S. Appl. No. 12/534,829 dated Apr. 19, 2011.

USPTO Notice of Allowance for U.S. Appl. No. 12/534,829 dated Oct. 28, 2011.

USPTO Notice of Allowance for U.S. Appl. No. 12/534,829 dated Dec. 5, 2011.

USPTO Notice of Allowance for U.S. Appl. No. 12/534,829 dated Dec. 21, 2011.

USPTO Office Action for U.S. Appl. No. 12/573,820 dated Mar. 2, 2011.

USPTO Office Action for U.S. Appl. No. 12/749,466 dated Jun. 29, 2011.

USPTO Office Action for U.S. Appl. No. 12/749,476 dated Apr. 11, 2011.

USPTO Office Action for U.S. Appl. No. 12/749,476 dated Nov. 8, 2011.

USPTO Notice of Allowance for U.S. Appl. No. 12/749,476 dated May 4, 2012.

USPTO Notice of Allowance for U.S. Appl. No. 12/762,269 dated Apr. 23, 2012.

USPTO Office Action for U.S. Appl. No. 12/762,271 dated Jun. 6, 2012.

USPTO Notice of Allowance for U.S. Appl. No. 12/778,718 dated Apr. 3, 2012.

USPTO Notice of Allowance for U.S. Appl. No. 12/778,718 dated Jun. 13, 2012.

USPTO Office Action for U.S. Appl. No. 12/868,441 dated Apr. 30, 2012.

USPTO Office Action for U.S. Appl. No. 12/880,803 dated Feb. 22, 2012.

USPTO Office Action for U.S. Appl. No. 12/883,093 dated Mar. 13, 2012.

USPTO Office Action for U.S. Appl. No. 12/883,652 dated Apr. 17, 2012.

USPTO Office Action for U.S. Appl. No. 12/884,993 dated Mar. 16, 2012.

USPTO Office Action for U.S. Appl. No. 13/014,622 dated Nov. 28, 2011.

USPTO Office Action for U.S. Appl. No. 13/014,622 dated Apr. 30, 2012.

USPTO Office Action for U.S. Appl. No. 13/046,565 dated Apr. 13, 2012.

USPTO Office Action for U.S. Appl. No. 12/995,946 dated Jan. 29, 2013.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

(56) References Cited

OTHER PUBLICATIONS

USPTO Notice of Allowance for U.S. Appl. No. 12/534,838 dated Jun. 8, 2012.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.
USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Office Action for U.S. Appl. No. 12/478,736 dated Feb. 7, 2012.
USPTO Notice of Allowance for U.S. Appl. No. 12/478,736 dated April 23, 2012.
USPTO Notice of Allowance for U.S. Appl. No. 12/478,736 dated Oct. 9, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/497,969 dated Feb. 2, 2012.
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,843 dated Jan. 24, 2013.
USPTO Office Action for U.S. Appl. No. 12/534,844 dated Sep. 16, 2010.
USPTO Office Action for U.S. Appl. No. 12/534,844 dated Feb. 4, 2011.
USPTO Notice of Allowance for U.S. Appl. No. 12/534,849 dated Jul. 31, 2012.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Notice of Allowance for U.S. Appl. No. 12/569,337 dated Nov. 15, 2012.
USPTO Office Action for U.S. Appl. No. 12/634,665 dated Apr. 25, 2012.
USPTO Office Action for U.S. Appl. No. 12/634,665 dated Oct. 1, 2012.
USPTO Notice of Allowance for U.S. Appl. No. 12/634,665 dated Feb. 15, 2013.
USPTO Office Action for U.S. Appl. No. 12/724,983 dated Mar. 5, 2012.
USPTO Office Action for U.S. Appl. No. 12/785,404 dated Mar. 6, 2012.
USPTO Notice of Allowance for U.S. Appl. No. 12/785,404 dated Jul. 16, 2012.
USPTO Office Action for U.S. Appl. No. 12/891,668 dated Sep. 25, 2012.
USPTO Office Action for U.S. Appl. No. 13/041,199 dated Nov. 30, 2012.
USPTO Office Action for U.S. Appl. No. 13/041,199 dated Mar. 12, 2013.
USPTO Office Action for U.S. Appl. No. 13/175,739 dated Dec. 7, 2012.
USPTO Office Action for U.S. Appl. No. 13/226,249 dated Oct. 10, 2012.
USPTO Notice of Allowance for U.S. Appl. No. 13/226,249 dated Feb. 21, 2013.
USPTO Notice of Allowance for U.S. Appl. No. 13/425,304 dated Aug. 22, 2012.
USPTO Office Action for U.S. Appl. No. 12/133,365 dated May 13, 2013.
USPTO Office Action for U.S. Appl. No. 12/497,969 dated May 16, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
Non-Final Office Action of Dec. 17, 2012 for U.S. Appl. No. 12/787,343, 8 pages.

(56) References Cited

OTHER PUBLICATIONS

Notice of Allowance of Jun. 10, 2013, 2013 for U.S. Appl. No. 12/787,343, 12 pages.
Non-Final Office Action of Oct. 7, 2013 for U.S. Appl. No. 13/752,158, 21 pages.
Notice of Allowance of Nov. 27, 2013, 2013 for U.S. Appl. No. 13/937,981, 12 pages.
Final Office Action of Apr. 1, 2014 for U.S. Appl. No. 13/752,158, 27 pages.

* cited by examiner

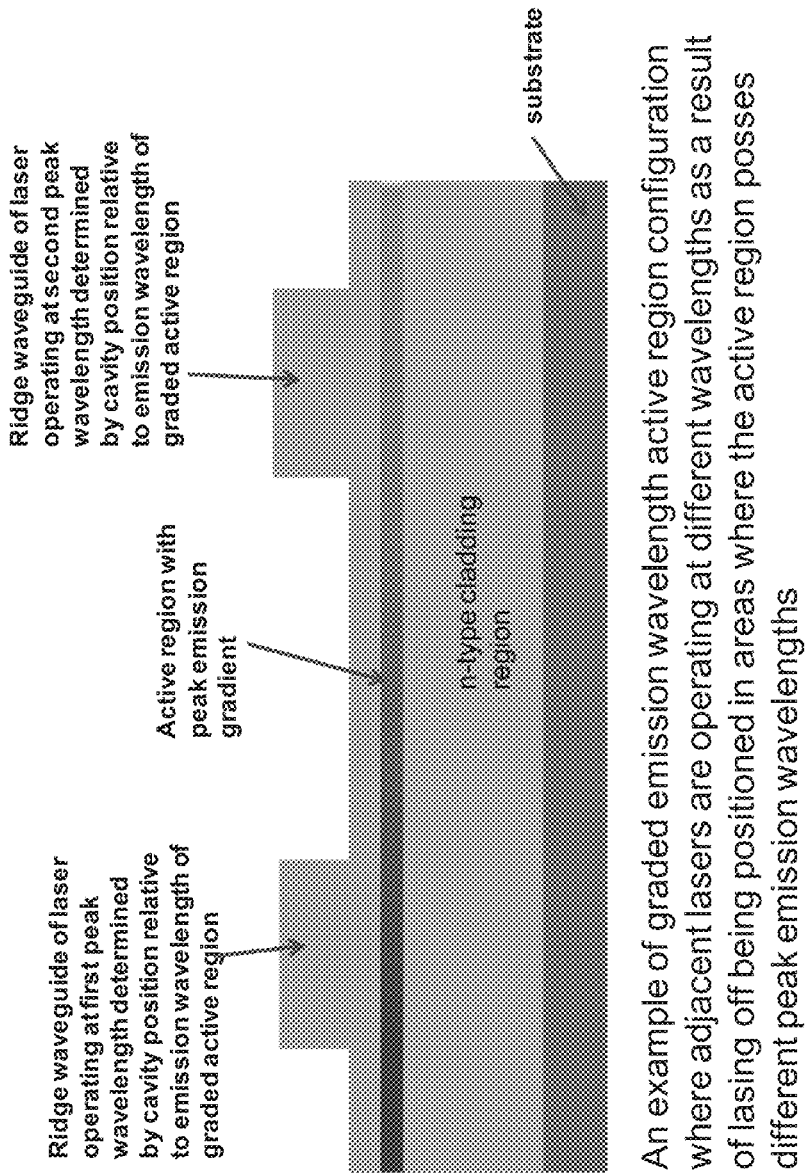

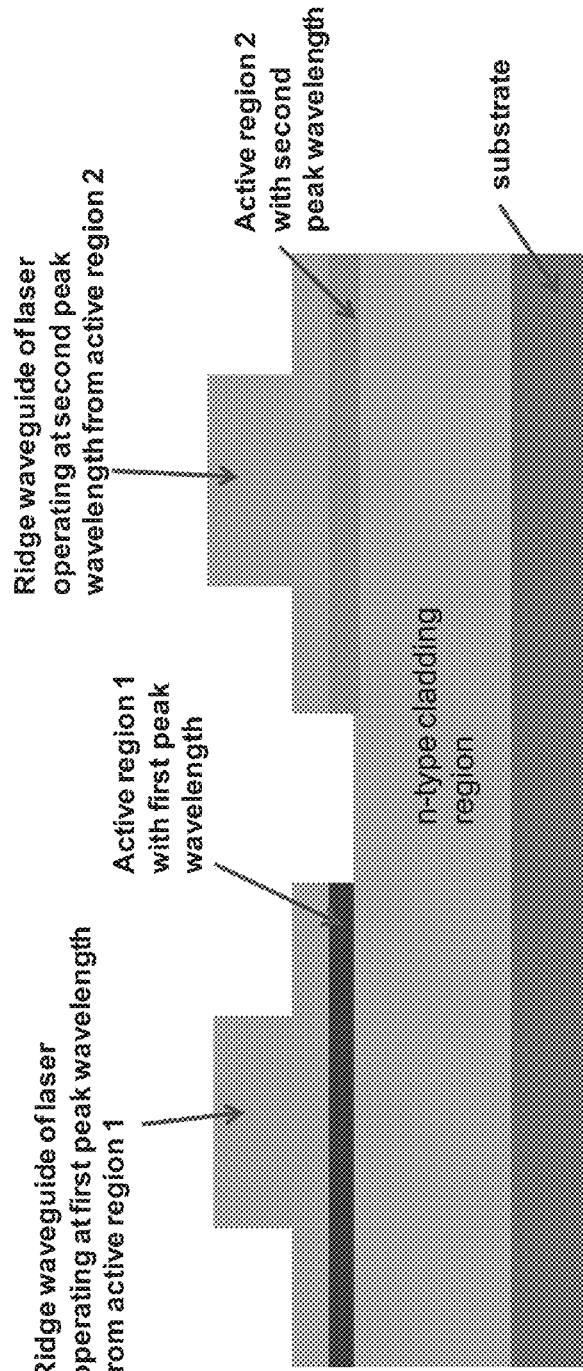

GALLIUM NITRIDE BASED LASER DAZZLING DEVICE AND METHOD

CROSS-REFERENCE TO RELATED APPLICATION

This application is a continuation of U.S. Application No. 12/787,343, filed May 25, 2010 and issued Aug. 13, 2013 as U.S. Pat. No. 8,509,275, which claims priority to U.S. Provisional Patent Application No. 61/182,104, filed May 29, 2009, both of which are incorporated by reference herein for all purposes.

BACKGROUND OF THE INVENTION

The present invention is related to laser devices. More specifically, embodiments of the present invention provide laser dazzling devices powered by one or more green laser diodes characterized by a wavelength of about 500 nm to 540 nm. In various embodiments, laser dazzling devices include non-polar and/or semi-polar green laser diodes. In a specific embodiment, a single laser dazzling device includes a plurality of green laser diodes, which may couple power together. There are other embodiments as well.

As human beings become more civilized, non-lethal techniques have been developed to temporarily halt others that may be dangerous or hostile. In any potentially hostile situation such as a military security checkpoint, a critical need exists to identify potentially threatening individuals or groups prior to undertaking an escalation of force. Non-lethal threat detection and deterrent techniques are commonly used, such as, megaphones, tire spike strips, traffic cones, fencing, and hand gestures. However, many of these are impractical in impromptu security environments, and such measures may not show enough force to deter potentially hostile parties. If a serious threat is anticipated, historically, warning shots were fired, but this action can actually accelerate tensions and result in unwanted and unnecessary escalation of force if the shots are perceived incorrectly by the approaching party. Moreover, once the warning shots have been fired, a common next step in the escalation of force is to engage the approaching party directly with gunfire which dramatically increases the likelihood in loss of life.

As a result, an intermediate means of threat detection using bright light has been developed and employed called laser dazzling. This measure provides less than lethal threat detection, assessment, and an opportunity for de-escalation while at the same time providing a strong visual warning which can "dazzle" or induce temporary blindness to disorient approaching hostile parties without causing permanent ocular damage. End users of these tools include soldiers on the battlefield, homeland security officers, police, and general security who find themselves in any potentially hostile situation.

An application of bright light for threat detection and deterrent goes back to early in the 20th century when soldiers used searchlights for this purpose. As lasers were developed in the 1960s, they became more portable, and by the 1980s, defense and security forces were using lasers as dazzlers because of their long range capability resulting from their collimated beam output. In the 1990s, the United Nations enacted the Protocol on Blinding Laser Weapons which outlawed weapons intended to cause permanent blindness, but which leave the door open to weapons which induce temporary blindness.

Laser dazzlers are a common tool in the defense and security market. They go by several names, including: laser dazzler, nonlethal visual disrupter, visual warning technology, nonlethal lasers, and others. In conventional laser dazzlers, green lasers are often employed. In order to generate the green laser light in the conventional laser dazzlers, a three stage laser is often required, typically referred to as a diode pumped solid state (DPSS) frequency doubled green laser. A conventional laser design typically includes:

A laser diode which outputs 808 nm laser light (typically powered by a battery)

The 808 nm laser is then focused into a solid state lasing crystal based on ND:YAG or Nd:Van. The crystals emit laser light at or near 1064 nm.

The 1064 nm is then incident on a frequency doubling crystal which creates green light through the second harmonic generation process where two 1064 nm photons are converted into a single 532 nm photon. The frequency doubling crystal is typically KTP, LBO, BBO, PPLN, or another similar material. While these conventional laser dazzling devices are functional, there are certain drawbacks. That is, conventional laser dazzlers are often complex and require complex optics and configurations. Additionally, such laser dazzlers are also expensive and difficult to scale. These and other drawbacks are described throughout the present specification and more particularly below.

Therefore, it is to be appreciated that improved systems and method for laser dazzling devices are desirable.

BRIEF SUMMARY OF THE INVENTION

According to the present invention, laser devices are provided. More specifically, embodiments of the present invention provide laser dazzling devices powered by one or more green laser diodes characterized by a wavelength of about 500 nm to 540 nm. In various embodiments, laser dazzling devices include non-polar and/or semi-polar green laser diodes. In a specific embodiment, a single laser dazzling device includes a plurality of green laser diodes. There are other embodiments as well.

In a specific embodiment, the present invention includes certain features for a laser dazzler as defined below:

Wavelength: Dazzlers are configured to output green light since the eye is most sensitive to green wavelengths. Specifically, for the same amount of optical power, the human eye is typically more than 5 times more sensitive to green light as compared to red or blue light in daylight conditions.

Power: Dazzlers output optical power ranges from 5 mW to 500 mW, depending on the range. It is noted that these power levels exceed the FDA's eye-safe power of a laser pointer (5 mW). As a result, the dazzler may be specified with a Nominal Ocular Hazard Distance (NOHD) which is the distance under which one can potentially cause eye injuries if used on anyone up to that distance. For example a dazzler may have an NOHD of 45 meters.

In addition to the laser, other features include telescoping optics to collimate the beam to a large or small spot at a given range, batteries, mechanics for handheld operation and integration with small arms, sighting, etc.

Minimal power consumption in order to minimize size, cost, weight of the battery and of the thermal management required Ruggedness over temperature, shock, vibration Compact size Lightweight Low cost Of course, there may be other variations, alternatives, and modifications.

According to an embodiment, the present invention provides a laser dazzling apparatus. The laser dazzling apparatus includes a housing member. The laser dazzling device includes a laser device. The laser device comprises at least a gallium and nitrogen containing device having an active region and a cavity member. The laser device is configured to emit a laser beam having a wavelength about 500 nm to 540 nm. The active regions include gallium nitride material, the laser beam being characterized by a first direction. The laser dazzling device includes a driving circuit electrically coupled to the laser device. The driving circuit is adapted to deliver electrical energy to the laser device. The electrical energy is less than 800 mW. The laser dazzling device includes a power source electrically coupled to the driving circuit. The laser dazzling device includes an activation module electrically coupled to the driving circuit. The activation module is configured to send an activation signal to the driving circuit. The laser dazzling device includes a sight for aligning the laser beam to a desired position.

According to another embodiment, the present invention provides a laser dazzling device. The laser dazzling device includes a laser device. The laser device comprises a green laser diode. The green laser diode comprises an active region and a cavity member. The green laser diode is configured to emit a laser beam at an intensity level of less than 800 mW. The active regions includes gallium nitride material. The laser beam is characterized by a first direction. The laser dazzling device includes a driving circuit electrically coupled to the laser device. The driving circuit is adapted to deliver electrical energy to the laser device. The electrical energy is less than 800 mW. The laser dazzling device includes a power source electrically coupled to the driving circuit. The laser dazzling device includes an activation module electrically coupled to the driving circuit. The activation module is configured to send an activation signal to the driving circuit, the activation module comprising an electrical trigger. The laser dazzling device includes a sight for aligning the laser beam to a desired position. In an alternative specific embodiment, the present invention provides a laser dazzler apparatus. The laser dazzler apparatus includes a laser device including a laser diode. The laser diode comprises a gallium and nitrogen containing substrate configured in a semi-polar orientation in one or more embodiments. The laser diode is configured to emit a laser beam characterized by at least a wavelength of about 490 nm to 540 nm according to a specific embodiment. The apparatus includes a power source electrically coupled to the laser device in a specific embodiment.

It is to be appreciated that embodiments of the present invention provide numerous advantages over conventional techniques. According to the present invention, a laser dazzling device implemented using one or more green laser diodes based on GaN technology has numerous advantages over existing DPSS approaches.

Efficiency: Because the GaN diode laser is a single stage, it is inherently more efficient and therefore requires less powerful batteries, decreasing the size, weight and cost. Moreover, the efficient generation of light minimizes waste heat which needs to be managed and carried away which further reduces size, weight, and cost.

Ruggedness and elimination of alignment: The green laser light is generated within the chip, so external optical alignment is not required to maintain lasing. This dramatically reduces cost in the manufacturing process and also eliminates failure mechanisms for the use in the field.

Broad temperature operation: The GaN diode laser approach is not sensitive to minor changes in temperature. Therefore, requirements for several controls are eliminated including sensors for temperature and/or light, along with active temperature controls such as heaters or thermoelectric coolers. This greatly reduces the system complexity, cost, size, and weight, and eliminates failure mechanisms.

Elimination of the dangers of the residual 1064 nm beam: This GaN design produces only a green laser beam and does not produce a 1064 nm beam. This eliminates the blocking filter reducing cost, and eliminates the risk of emitting an extremely dangerous infrared beam.

Design flexibility in wavelength: By using the GaN approach, it is possible to achieve a slightly different wavelength such as 515 nm or 500 nm from the device. Such flexibility is important for dazzlers designed for dark environments, where the eye's sensitivity shifts and 500 nm is actually 20% brighter to the eye than light at 530 nm. Moreover, the flexible design enables one to fabricate a slightly different green wavelength which may be useful in preventing hostile parties from using 532 nm narrow band filter to avoid the effect of dazzling.

According to specific embodiments, green laser diodes (using nonpolar and/or semipolar GaN) for non lethal threat detection, threat assessment, threat de-escalation, visual warning technology, and laser dazzling are provided.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 2B is a simplified diagram illustrating a cross-section of an active region with graded emission wavelength.

FIG. 2C is a simplified diagram illustrating a laser device with multiple active regions according embodiments of the present invention.

DETAILED DESCRIPTION OF THE INVENTION

Figure 1:
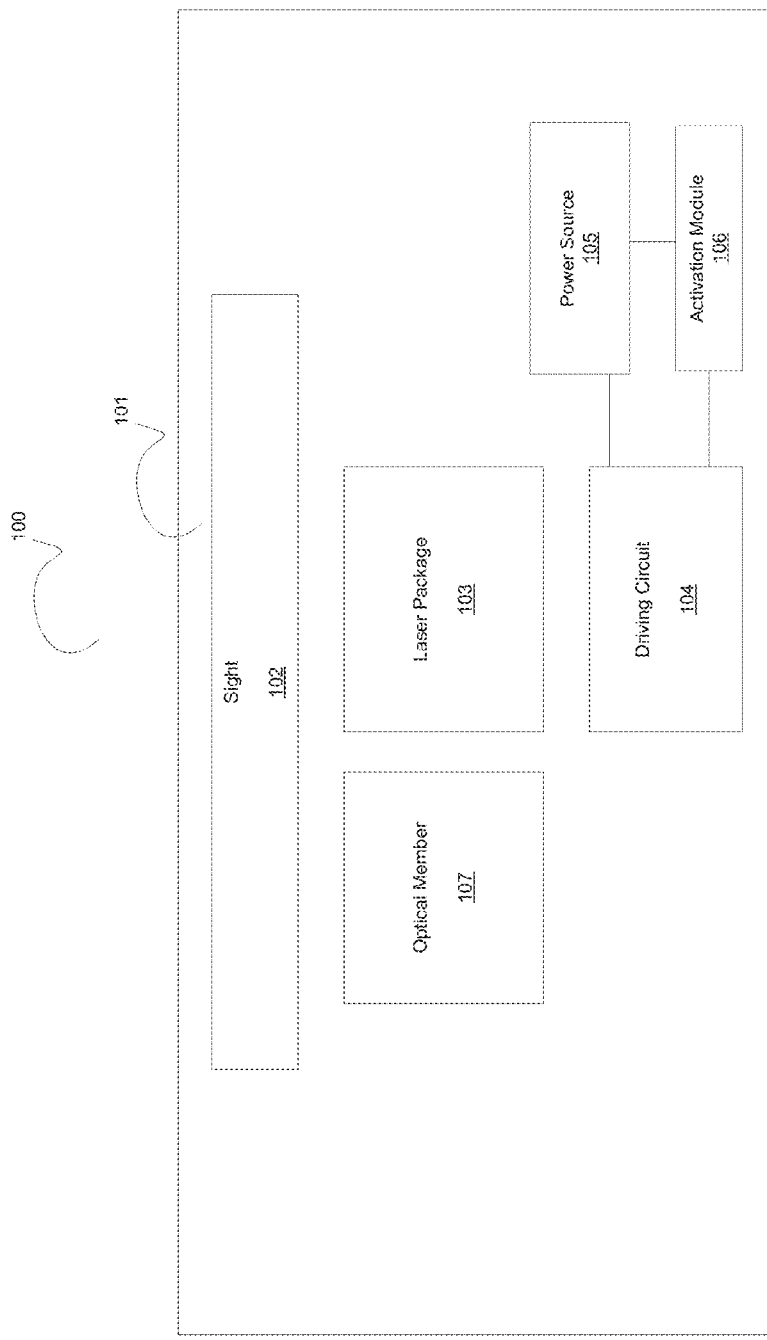
FIG. 1 is a simplified block diagram illustrating a laser dazzling device according to an embodiment of the present invention.

According to the present invention, techniques related to laser dazzling are provided. More specifically, embodiments of the present invention provide laser dazzling devices powered by one or more green laser diodes characterized by a wavelength of about 500 nm to 540 nm. In various embodiments, laser dazzling devices according to the present invention include non-polar and/or semi-polar green laser diodes. In a specific embodiment, a single laser dazzling device includes a plurality of green laser diodes. There are other embodiments as well.

As described above, conventional laser devices are often inadequate for various reasons. More specifically, conventional DPSS laser devices are often inefficient. Although the three stage DPSS lasers do generate green laser light for the application today, several critical limitations of this design are noted below:

Inefficiency: Because each of the 3 processes is not perfectly efficient and has inherent loss, these green DPSS lasers are inefficient and therefore require powerful batteries to drive them, increasing the size, weight and cost. Moreover, the inefficient generation of light results in wasted heat which needs to be managed and carried away which adds to the bulk and expense.

Fragility and sensitivity to alignment: In is absolutely critical to align each of the beams and crystals and optics with respect to one another in order to generate the green light. If misalignment occurs in assembly or in application, the green laser light generation will cease altogether. This adds cost in the manufacturing process and also presents failure mechanisms for the use in the field.

Temperature sensitivity: in order to achieve the 808 nm conversion to 1064 nm and the 1064 nm conversion to 532 nm, the temperature of the diode laser and/or crystals need to be precisely controlled. Minor changes in temperature beyond a few degrees C° can cause the green light generation process to decrease substantially or cease altogether. In order to overcome this, sensors for temperature and/or light, along with active temperature controls such as heaters or thermoelectric coolers are employed to maintain lasing in the green. These measures add to the system's cost, size, and weight, and present additional failure mechanisms.

Danger of the residual 1064 nm beam: This DPSS design produces a 1064 nm laser beam with power several times that of the green beam. While some of this light is converted to the green, residual 1064 nm laser light is inherent in the system since the frequency conversion process is not perfect. This residual infrared laser beam is typically blocked by the manufacturer using a filter which adds cost. If the filter were somehow to fail and the residual 1064 nm beam was emitted, the 1064 nm beam would be extremely dangerous because it is invisible to the human eye and may have enough power to cause blindness.

Fixed wavelength at 532 nm prevents flexible designs: Use of the DPSS approach results in a single wavelength output that is a property of the crystals used. It is not possible to achieve a slightly different wavelength such as 515 nm or 500 nm from the device unless another crystal would be invented. Such flexibility would be attractive since, in dark environments, the eye's sensitivity shifts and light at a wavelength of 500 nm is actually 20% brighter to the eye than light at 530 nm. Moreover, hostile parties may attempt to use narrow band filters to avoid the effect of dazzling, and using a slightly different green wavelength may be needed in the future.

In various embodiments, the present invention provide laser dazzling devices implemented using green laser diodes that directly produces green laser beams. More specifically, by utilizing a GaN diode laser that directly produces a green laser beam from a single stage design, one can efficiently produce a green beam from a tiny laser chip and eliminate or mitigate these drawbacks to existing DPSS systems in the field of laser dazzlers. According to the present invention, a green laser diode based on GaN technology would have the following advantages over existing DPSS approaches:

Efficiency: Because the GaN diode laser is a single stage, it is inherently more efficient and therefore requires less powerful batteries, decreasing the size, weight and cost. Moreover, the efficient generation of light minimizes waste heat which needs to be managed and carried away which further reduces size, weight, and cost.

Ruggedness and elimination of alignment: The green laser light is generated within the chip, so external optical alignment is not required to maintain lasing. This dramatically reduces cost in the manufacturing process and also eliminates failure mechanisms for the use in the field.

Broad temperature operation: The GaN diode laser approach is not sensitive to minor changes in temperature. Therefore, requirements for several controls are eliminated including sensors for temperature and/or light, along with active temperature controls such as heaters or thermoelectric coolers. This greatly reduces the system complexity, cost, size, and weight, and eliminates failure mechanisms.

Elimination of the dangers of the residual 1064 nm beam: This GaN design produces only a green laser beam and does not produce a 1064 nm beam. This eliminates the blocking filter reducing cost, and eliminates the risk of emitting an extremely dangerous infrared beam.

Design flexibility in wavelength: By using the GaN approach, it is possible to achieve a slightly different wavelength such as 515 nm or 500 nm from the device. Such flexibility is important for dazzlers designed for dark environments, where the eye's sensitivity shifts and 500 nm is actually 20% brighter to the eye than light at 530 nm. Moreover, the flexible design enables one to fabricate a slightly different green wavelength which may be useful in preventing hostile parties from using 532 nm narrow band filter to avoid the effect of dazzling.

FIG. 1 is a simplified block diagram illustrating a laser dazzling device according to an embodiment of the present invention. This diagram is merely an example, which should not unduly limit the scope of the claims herein. One of ordinary skill in the art would recognize other variations, modifications, and alternatives. As shown in FIG. 1, a laser dazzling device 100 includes a housing 101, a sight 102, a laser device 103, a driving circuit 104, a power source 105, an activation module 106, and an optical member 107. It is to be appreciated that there can be other components as well.

The housing member 101 provides an enclosure for the components of the laser dazzling device. Depending on the specific application, the housing member 101 may be in various types of shapes. For example, the housing member 101 can be shaped like a pistol and includes a pistol grip. Alternatively, the housing member 101 can be shaped like a rifle and comprises a rifle stock. Additionally, the housing member can be attached to vehicle mount and/or include a tripod.

The laser device 103 according to embodiments of the present invention includes one or more laser diodes that directly emit green laser beam without using frequency alteration (e.g., frequency double or DPSS) techniques. In a specific embodiment, the laser device includes a green laser diode that includes an active region and a cavity member. The green laser diode is configured to emit a laser beam having a wavelength about 500 nm to 540 nm. In a specific embodiment, the wavelength is about 532 nm. The active region of the green laser diode includes gallium nitride material. For example, the green laser diode includes a mirror surface where the laser beam is emitted, and the laser beam is characterized by a first direction. Depending on the application, the green laser diode can be associated with one or more operational modes. For example, each of the operational modes is associated with an operating frequency.

In one embodiment, the laser device 103 comprises a plurality of green laser diodes sharing a single substrate. For example, the green laser diodes are monolithically integrated during the manufacturing process of the green laser diode, as is described below. By using a plurality of green laser diodes, the power level of the laser dazzling device can be increased. For example, a high power laser device, having a plurality of green laser diodes, is used for high-power military laser dazzling systems wherein the laser beams are used to disable weapon's sensors. Alternatively, the laser device 103 comprises a plurality of green laser diodes sharing a single package.

According to various embodiments of the present invention, the green laser diode can be semi-polar or non-polar. For example, green laser diodes are fabricated from a bulk substrate. Since the green laser diodes directly emit laser beam in green wavelength range, the laser dazzling device is free from a frequency doubling crystal.

In many instances, the output power level of laser dazzling device needs to be limited to avoid permanent injury to eyes. In a specific embodiment, the laser beam is characterized by an energy level of less than 500 mW.

The driving circuit 104 is electrically coupled to the laser device 103. Among other things, the driving circuit 104 is specifically adapted to deliver electrical energy to the laser device. For example, the electrical energy can be less than 800 mW. The driving circuit 104 may deliver electrical energy to the laser device 103 in various ways. In one embodiment, the driving circuit is adapted to deliver electrical energy to the laser device in pulses.

The power source 105 is electrically coupled to the driving circuit. For example, the power source comprises a battery. The battery may be rechargeable or disposable. For example, NiMH or LiON rechargeable battery is used for the power source.

The activation module 106 is electrically coupled to the driving circuit. The activation module is configured to send an activation signal to the driving circuit. For example, an operator is able to cause the driving circuit to provide electrical energy to the laser device, which in response emit a laser beam. In one embodiment, the activation module is configured like a traditional trigger unit, which includes a trigger and a safety.

The sight 102 is provided for aligning the laser beam to a desired position. Depending on the application, the sight can be an open sight, an aperture sight, a red dot sight, a hologram sight, and/or a scope.

The optical member 107 is used to focus the laser beam. In an embodiment, the optical member 107 is positioned within a vicinity of the emitting portion of the laser device. For example, the optical member 107 includes collimation lens and telescope to collimate and size the laser beam. In one embodiment, the optical member 107 includes an optical concentrator aligned with the laser device. In another embodiment, the optical member comprises waveguide for projecting the laser beam along the first direction.

Figure 1A:
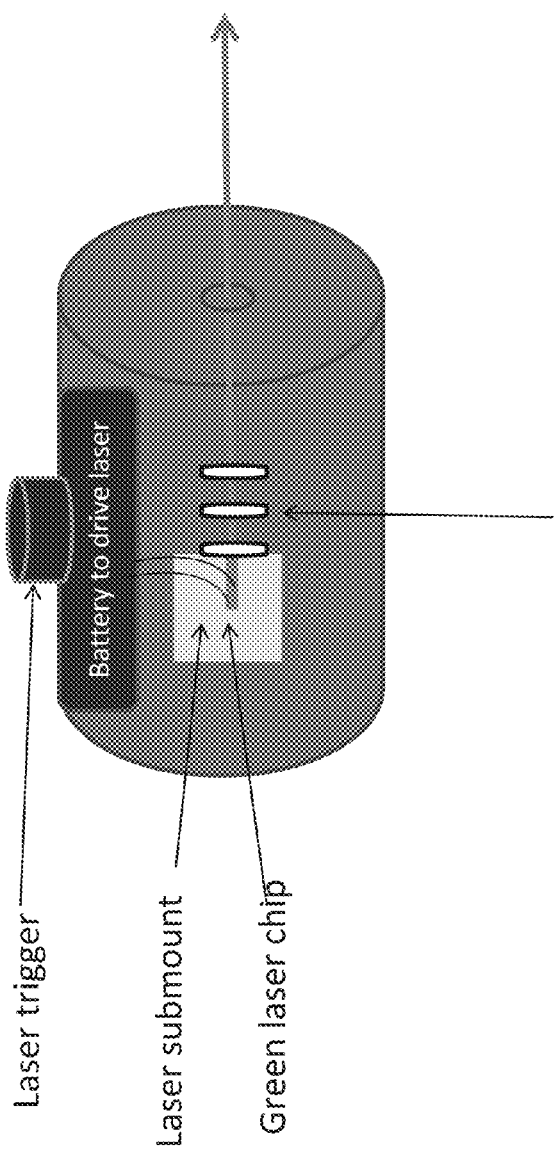
FIG. 1A is a simplified diagram illustrating an alternative laser dazzling device according to an embodiment of the present invention.

As mentioned above, various components of the laser dazzling device 100 may be added, removed, modified, and/or replaced. FIG. 1A is a simplified diagram illustrating an alternative laser dazzling device according to an embodiment of the present invention. This diagram is merely an example, which should not unduly limit the scope of the claims herein. One of ordinary skill in the art would recognize other variations, modifications, and alternatives.

Figure 2A:
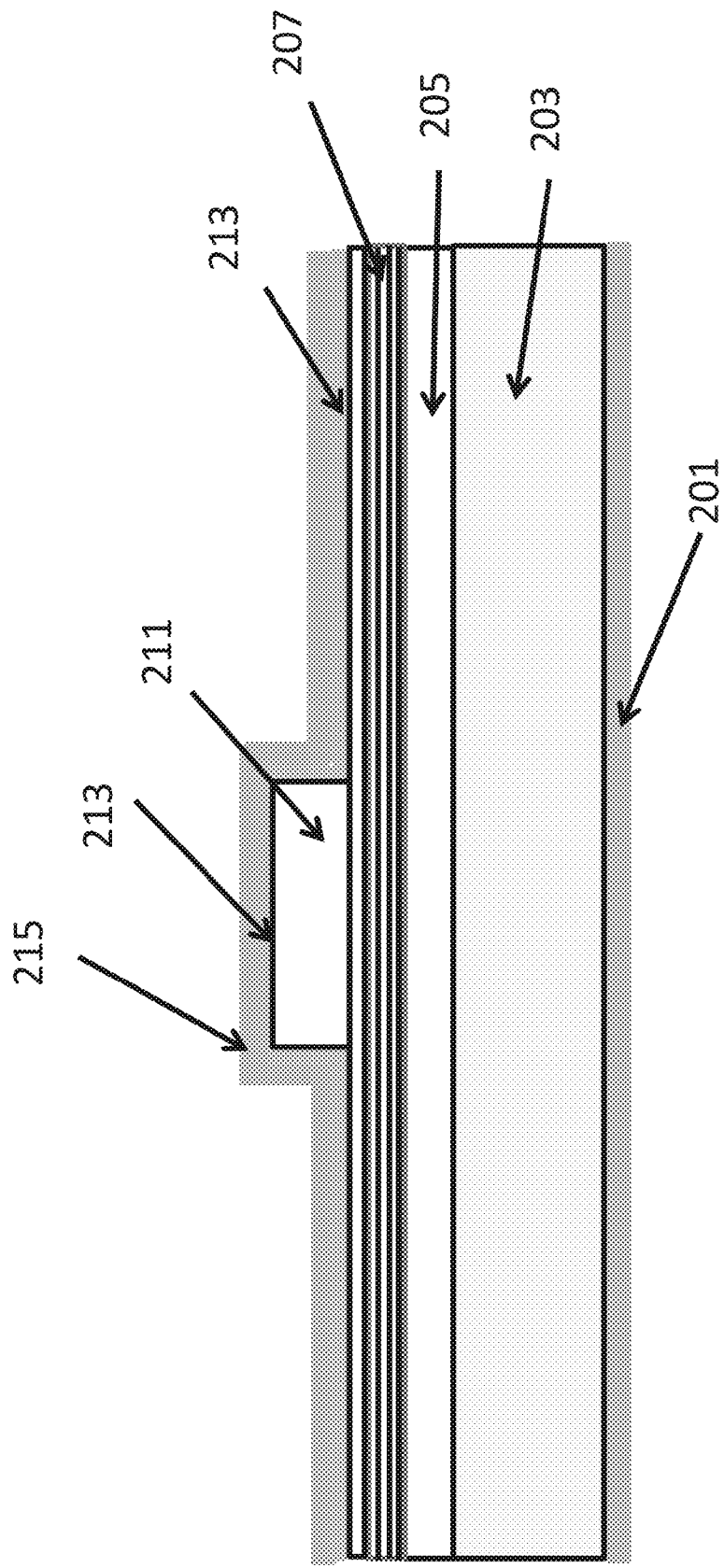
FIG. 2A is a detailed cross-sectional view of a laser device 200 fabricated on a {20-21} substrate according to an embodiment of the present invention.

As mentioned above, the laser dazzling devices, according to the present invention, utilize green laser diodes. FIG. 2A is a detailed cross-sectional view of a laser device 200 fabricated on a {20-21} substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 211. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, $v$, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under a flow of ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 211. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes contact region 213. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), nickel gold (Ni/Au), but can be others. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$ and $Al_yIn_zGa_{1-y-z}N$, respectively, where $0 \le w, x, y, z, w+x, y+z \le 1$, where $w<u$, y and/or $x>v$, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \le s$, t, $s+t \le 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes contact region 213. In a specific embodiment, the dielectric region is an oxide such as silicon dioxide, but can be others. Of course, there can be other variations, modifications, and alternatives.

According to an embodiment, the as-grown material gain peak is varied spatially across a wafer. As a result, different wavelength and/or color can be obtained from one fabricated laser to the next laser on the same wafer. The as-grown gain peak wavelength can be shifted using various methods according to embodiments of the present invention. According to one embodiment, the present invention utilizes growth non-uniformities where the as-grown material has an emission wavelength gradient. For example, the growth non-uniformity can be obtained a result of temperature and/or growth rate gradients in the light emitting layers in the epitaxial growth chamber. For example, such wavelength gradients can be intentional or non-intentional, and the differences in wavelengths range from 10 to 40 nm deviation. For example, this method enables multiple lasers on the same chip to operate at different wavelengths.

In a specific embodiment, an optical device configured to provide laser beams at different wavelengths is provided. The device includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}). The device also includes an active region comprising a barrier layer and a light emission layer, the light emission layer being characterized by a graduated profile associated with a peak emission wavelength gradient, the peak emission wavelength gradient having a deviation of at least 10 nm. Also, the device includes a first cavity member overlaying a first portion of the emission layer, the first portion of the emission layer being associated with a first wavelength, the first cavity member being characterized by a length of at least 100 um and a width of at least 0.5 um, the first cavity member being adapted to emit a first laser beam at the first wavelength. The device further includes a second cavity member overlaying a second portion of the emission layer, the second portion of the emission layer being associated with a second wavelength, a difference between the first and second wavelengths being at least 50 nm, the second cavity member being characterized by a length of at least 100 um and a width of at least 0.5 um, the second cavity member being adapted to emit a second laser beam at a second wavelength. Additionally, the device includes an output region wherein the first laser beam and the second laser beam are combined.

As mentioned above, a laser dazzling device may include multiple green laser diodes for various purposes, such as increased power level, varying wavelength, and others. FIG. 2B is a simplified diagram illustrating a cross-section of an active region with graded emission wavelength. This diagram is merely an example, which should not unduly limit the scope of the claims. One of ordinary skill in the art would recognize many variations, alternatives, and modifications.

In certain embodiments of the present invention, multiple laser wavelengths output is obtained by manipulating the as-grown gain peak through selective area epitaxy (SAE), where dielectric patterns are used to define the growth area and modify the composition of the light emitting layers. Among other things, such modification of the composition can be used to cause different gain peak wavelengths and hence different lasing wavelengths. For example, by using SAE processes, a device designer can have a high degree of spatial control and can safely achieve 10-30 nm, and sometimes even more, of wavelength variation over the lasers. For example, the SAE process is described in a U.S. patent application Ser. No. 12/484,924, filed Jun. 15, 2009, entitled "SELECTIVE AREA EPITAXY GROWTH METHOD AND STRUCTURE FOR MULTI-COLOR DEVICES". For example, this method enables multiple lasers on the same chip to operate at different wavelengths.

In a specific embodiment, a laser apparatus manufactured using SAE process with multiple wavelengths and/or color is provided. The laser apparatus includes a gallium and nitrogen containing substrate including a first crystalline surface region orientation. The apparatus also includes an active region comprising a barrier layer and a plurality of light emission layers, the plurality of light emission layers including a first emission layer and a second emission layer, the first emission layer being characterized by a first wavelength, the second emission layer being characterized by a second wavelength, a difference between the first wavelength and the second wavelength is at least 10 nm. For example, the first and second emission layers are formed using selective area epitaxy processes.

The apparatus includes a first cavity member overlaying the first emission layer, the first cavity member being characterized by a length of at least 100 um and a width of at least 0.5 um, the first cavity member being adapted to emit a first laser beam at the first wavelength. The apparatus also includes a second cavity member overlaying the second the emission layer, the second cavity member being characterized by a length of at least 100 um and a width of at least 0.5 um the second cavity member being adapted to emit a second laser beam at the second wavelength. The apparatus additionally includes an output region wherein the first laser beam and the second laser beam are combined.

As explained above, it is often desirable to combine the first and second wavelengths or colors associated thereof for various applications. For example, the apparatus may have optics having dichroic coatings for combining the first and the second laser beam. In one embodiment, the apparatus includes a plurality of polarizing optics for combining the first and the second laser beam. In a specific embodiment, the first cavity member and the second cavity member share a common cleaved facet of mirror edges, which is configured to combine the first and second laser beams.

The first and second laser beams can be associated with a number of color combinations. For example, the first wavelength is associated with a green color and the second wavelength is associated with a blue color.

It is to be appreciated that the laser apparatus can be implemented on various types of substrates. For example, the first crystalline surface region orientation can be a {20-21} plane, and first crystalline surface region orientation can also be a {30-31} plane.

The laser apparatus may also include other structures, such as a surface ridge architecture, a buried hetereostructure architecture, and/or a plurality of metal electrodes for selectively exciting the active region For example, the active region comprises a first and second gallium and nitrogen containing cladding layers and an indium and gallium containing emitting layer positioned between the first and second cladding layers. The laser apparatus may further includes an n-type gallium and nitrogen containing material and an n-type cladding material overlaying the n-type gallium and nitrogen containing material.

In certain embodiments of the present invention, multiple laser wavelengths and/or colors are obtained by providing multiple active regions, and each of the active regions is associated with a specific wavelength (or color). More specifically, multiple growth of active regions is performed across a single chip. In this technique a wafer is loaded in a growth chamber for the growth of an active region with one gain peak. After this growth, the wafer is subjected to one or more lithography and processing steps to remove a portion of the active region in some areas of the wafer. The wafer would then be subjected to a second growth where a second active region with a second peak gain wavelength is grown. Depending on the specific need, the processes of growing and removing active regions can be repeated many times. Eventually, this may be followed by the fabrication of laser diodes strategically positioned relative to these different active regions to enable lasing at various wavelengths.

FIG. 2C is a simplified diagram illustrating a laser device with multiple active regions according to embodiments of the present invention. This diagram is merely an example, which should not unduly limit the scope of the claims. One of ordinary skill in the art would recognize many variations, alternatives, and modifications. As an example, each active region is used to emit a green laser beam.

According to an embodiment, the following steps are performed in a method for forming a device that includes laser devices having multiple active regions:
1. providing a gallium and nitrogen containing substrate including a first crystalline surface region orientation;
2. defining a first active region by performing a selective etching process;
3. forming a barrier layer within the first active region;
4. growing a first emission layer within the first active region, the first emission layer being characterized by a first wavelength;
5. defining a second active region by performing a selective etching process;
6. growing a second emission layer within the second active area, the second emission layer being characterized by a second wavelength, a difference between the first gain peak wavelength and the second gain peak wavelength being at least 10 nm;
7. forming a first cavity member overlaying the first emission layer, the first cavity member being characterized by a length of at least 100 um and a width of at least 0.5 um, the first cavity member being adapted to emit a first laser beam at the first wavelength;
8. forming a second cavity member overlaying the second the emission layer, the second cavity member being characterized by a length of at least 100 um and a width of at least 0.5 um the second cavity member being adapted to emit a second laser beam at the second wavelength; and aligning the first and second cavity members to combine the first and second laser beams at a predetermined region.

Depending on the application, the above method may also include other steps. For example, the method may include providing an optical member for combining the first and second laser beams. In one embodiment, the method includes shaping a first cleaved surface of the first cavity member, shaping a second cleaved surface of the second cavity member, and aligning the first and second cleaved surfaces to cause the first and second laser beams to combine.

It is to be appreciated that the method described above can be implemented using various types of substrates. As explained above, the substrate member may have a surface region on the polar plane (c-plane), nonpolar plane (m-plane, a-plane), and semipolar plain ({11-22}, {10-1-1}, {20-21}, {30-31}). In the method described above, two active regions and two cavity members are formed. For example, each active region and cavity member pair is associated with a specific wavelength. Depending on the application, additional active regions and cavity members may be formed to obtain desired wavelengths and/or spectral width. In a preferred embodiment, each of the active regions is characterized by a specific spatial dimension associated with a specific wavelength.

In a specific embodiment, a laser apparatus having multiple active regions that provide multiple wavelengths and/or colors is described. The laser apparatus includes a gallium and nitrogen containing substrate including a first crystalline surface region orientation. In a specific embodiment, the substrate comprises Indium bearing material. The apparatus also includes a first active region comprising a barrier layer and a first emission layer, the first emission layer being characterized by a first gain peak wavelength. The apparatus includes a second active region comprising a second emission layer, the second emission layer being characterized by a second gain peak wavelength, a difference between the first gain peak wavelength and the second gain peak wave length is at least 10 nm.

The apparatus further includes a first cavity member overlaying the first emission layer, the first cavity member being characterized by a length of at least 100 um and a width of at least 0.5 um, the first cavity member being adapted to emit a first laser beam at the first wavelength. The apparatus additionally includes a second cavity member overlaying the second emission layer, the second cavity member being characterized by a length of at least 100 um and a width of at least 0.5 um the second cavity member being adapted to emit a second laser beam at the second wavelength. The apparatus further includes an output region wherein the first laser beam and the second laser beam are combined.

As explained above, it is often desirable to combine the first and second wavelengths or colors associated thereof for various applications. For example, the apparatus may have optics having dichroic coatings for combining the first and the second laser beam. In one embodiment, the apparatus includes a plurality of polarizing optics for combining the first and the second laser beam. In a specific embodiment, the first cavity member and the second cavity member share a common cleaved facet of mirror edges, which is configured to combine the first and second laser beams.

The first and second laser beams can be associated with a number of color combinations. For example, the first wavelength is associated with a green color and the second wavelength is associated with a blue color.

It is to be appreciated that the laser apparatus can be implemented on various types of substrates. For example, the first crystalline surface region orientation can be a {20-21} plane, and first crystalline surface region orientation can also be a {30-31} plane.

The laser apparatus may also include other structures, such as a surface ridge architecture, a buried hetereostructure architecture, and/or a plurality of metal electrodes for selectively exciting the active region. For example, the active region comprises first and second gallium and nitrogen containing cladding layers and an indium and gallium containing emitting layer positioned between the first and second cladding layers. The laser apparatus may further include an n-type gallium and nitrogen containing material and an n-type cladding material overlying the n-type gallium and nitrogen containing material.

It is to be that appreciated embodiments of the present invention provide methods for obtaining multiple laser wavelengths and/or colors after the active regions have already been formed. More specifically, the gain-peak of the semiconductor material can be spatially manipulated post-growth through quantum well intermixing (QWI) processes and/or disordering of the light emitting layers. A QWI process makes use of the metastable nature of the compositional gradient found at heterointerfaces. The natural tendency for materials to interdiffuse is the basis for the intermixing process. Since the lower energy light emitting quantum well layers are surrounded by higher energy barriers of a different material composition, the interdiffusion of the well-barrier constituent atoms will result in higher energy light emitting layers and therefore a blue-shifted (or shorter) gain peak.

The rate at which this process takes place can be enhanced with the introduction of a catalyst. Using a lithographically definable catalyst patterning process, the QWI process can be made selective. This is the process by which virtually all selective QWI is performed, whether it is by the introduction of impurities or by the creation of vacancies. There are a great number of techniques that have evolved over the years to accomplish selective intermixing, such as impurity-induced disordering (IID), impurity-free vacancy-enhanced disordering (IFVD), photoabsorption-induced disordering (PAID), and implantation-enhanced interdiffusion to name just a few. Such methods are capable of shifting the peak gain wavelengths by 1 to over 100 nm. By employing one of these mentioned or any other QWI method to detune the gain peak of adjacent laser devices, the convolved lasing spectrum of the side by side devices can be altered.

In one embodiment, an laser apparatus capable of multiple wavelength is manufactured by using QWI processes described above. The apparatus includes a gallium and nitrogen containing substrate including a first crystalline surface region orientation. The apparatus also includes an active region comprising a barrier layer and a plurality of light emission layers, the plurality of light emission layers including a first emission layer and a second emission layer, the barrier layer being characterized by a first energy level, the first emission layer being characterized by a first wavelength and a second energy level, the second energy level being lower than the first energy level, the first emission layer having a first amount of material diffused from the barrier layer, the second emission layer being characterized by a second wavelength, a difference between the first gain peak wavelength and the second gain peak wave length being at least 10 nm. For example, the second emission layer has a second amount of material diffused from the barrier layer.

The apparatus also includes a first cavity member overlaying the first emission layer, the first cavity member being characterized by a length of at least 100 um and a width of at least 0.5 um, the first cavity member being adapted to emit a first laser beam at the first wavelength. The apparatus includes a second cavity member overlaying the second the emission layer, the second cavity member being characterized by a length of at least 100 um and a width of at least 0.5 um the second cavity member being adapted to emit a second laser beam at the second wavelength. The apparatus includes an output region wherein the first laser beam and the second laser beam are combined.

Depending on the application, the active region may include various types of material, such as InP material, GaAs material, and others. The apparatus may have optics having dichroic coatings for combining the first and the second laser beam. In one embodiment, the apparatus includes a plurality of polarizing optics for combining the first and the second laser beam. In a specific embodiment, the first cavity member and the second cavity member share a common cleaved facet of mirror edges, which is configured to combine the first and second laser beams. The first and second laser beams are both green but in slightly different wavelengths.

It is to be appreciated that the laser apparatus can be implemented on various types of substrates. For example, the first crystalline surface region orientation can be a {20-21} plane, and first crystalline surface region orientation can also be a {30-31} plane. The laser apparatus may also include other structures, such as a surface ridge architecture, a buried hetereostructure architecture, and/or a plurality of metal electrodes for selectively exciting the active region For example, the active region comprises first and second gallium and nitrogen containing cladding layers and an indium and gallium containing emitting layer positioned between the first and second cladding layers. The laser apparatus may further include an n-type gallium and nitrogen containing material and an n-type cladding material overlying the n-type gallium and nitrogen containing material.

In various embodiments, laser diodes formed on different substrates are packaged together. It is to be appreciated that by sharing packaging of laser diodes, it is possible to produce small device applications (e.g., pico projectors), as multiple laser diodes can tightly fit together. For example, light engines having laser diodes in multiple colors are typically capable of reducing the amount of speckles in display applications. In addition, co-packaged laser diodes are often cost-efficient, as typically fewer optics are needed to combined laser beam outputs from laser diodes as a result of sharing packages.

Figure 3:
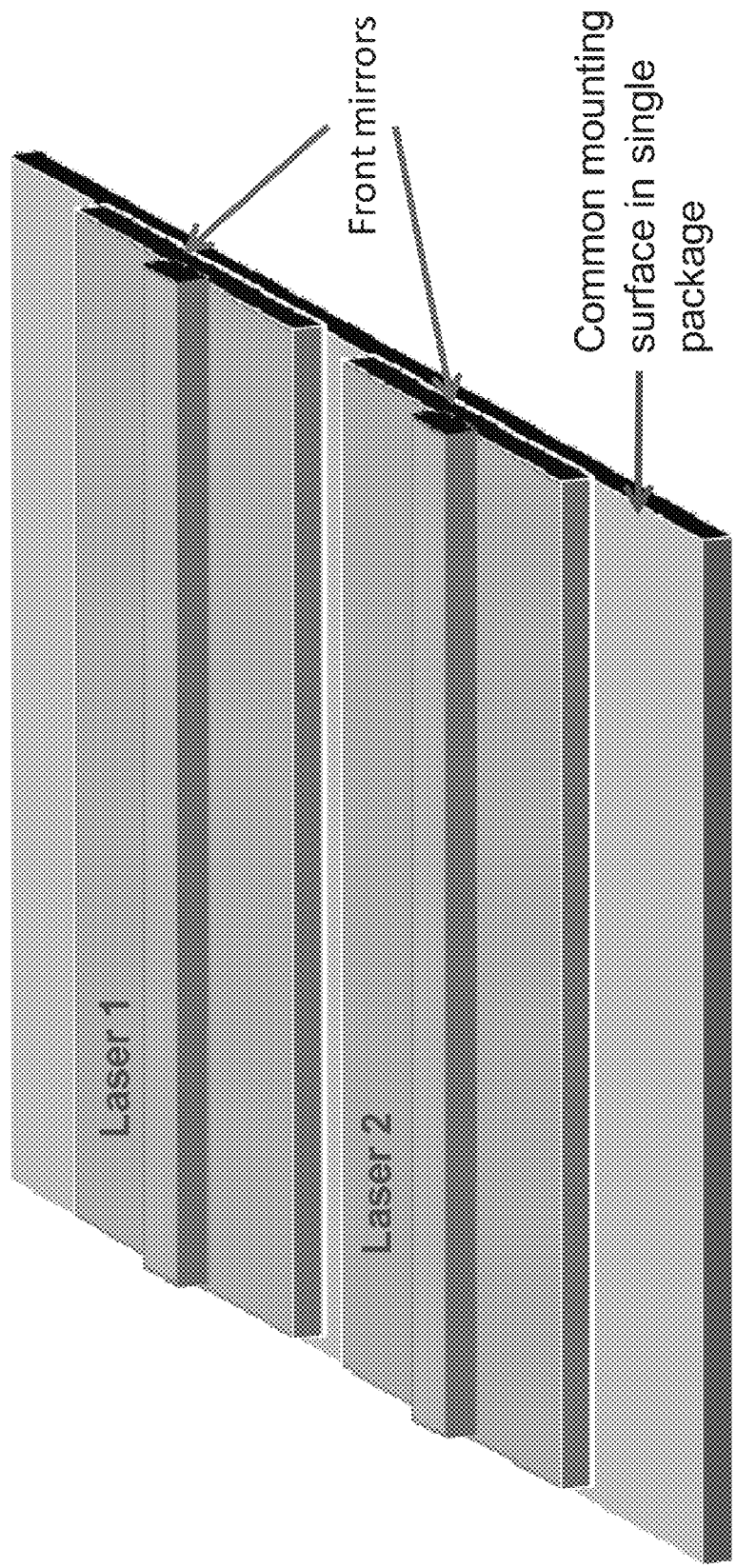
FIG. 3 is a simplified diagram of copackaged laser diodes mounted on common surface within a single package.

FIG. 3 is a simplified diagram of copackaged laser diodes mounted on common surface within a single package. This diagram is merely an example, which should not unduly limit the scope of the claims herein. One of ordinary skill in the art would recognize other variations, modifications, and alternatives. For example, both laser 1 and laser 2 are green laser diodes. By combining the output from both laser diodes, a combined laser beam with high power output can be achieved.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of using a laser dazzling apparatus comprising:
   providing a laser dazzling apparatus comprising:
   a housing member;
   a laser device arranged in the housing member, the laser device including an active region and a cavity member, the laser device being configured to emit a laser beam having a wavelength about 500 nm to 540 nm, the active region including gallium nitride material, the laser beam being characterized by a first direction;
   a driving circuit electrically coupled to the laser device, the driving circuit being adapted to deliver electrical energy to the laser device, the electrical energy being less than 800 mW;
   a power source electrically coupled to the driving circuit;
   an activation module electrically coupled to the driving circuit, the activation module being configured to send an activation signal to the driving circuit; and
   a sight for aligning the laser beam to a desired position; and directing the laser beam at a target.

2. The method of claim 1, wherein the laser device is associated with one or more operational modes, and each of the operational modes is associated with an operating frequency.

3. The method of claim 1, further comprising an optical concentrator aligned with the laser device.

4. The method of claim 1, wherein the laser device comprises a plurality of green laser diodes sharing a single substrate.

5. The method of claim 1, where the laser device comprises a non-polar green laser diode.

6. The method of claim 1, where the laser device comprises a semi-polar green laser diode.

7. The method of claim 1, wherein the laser device is fabricated from a bulk substrate.

8. The method of claim 1, wherein the laser device is free from a frequency doubling crystal.

9. The method of claim 1, wherein the laser beam is characterized by an energy level of less than 600 mW.

10. The method of claim 1, wherein the laser beam is characterized by an energy level of less than 400 mW.

11. The method of claim 1, wherein the laser device further comprises a waveguide for projecting the laser beam along the first direction.

12. The method of claim 1, wherein the laser device comprises a plurality of green laser diodes sharing a single package.

13. The method of claim 1, further comprising an optic for adjusting a size of the laser beam at a predetermined distance.

14. The method of claim 1, wherein the sight comprises an open sight.

15. The method of claim 1, wherein the sight comprises an aperture sight.

16. The method of claim 1, wherein the sight comprises a red dot sight.

17. The method of claim 1, wherein the sight comprises a hologram sight.

18. The method of claim 1, wherein the sight comprises a scope.

19. The method of claim 1, wherein the housing comprises a pistol grip.

20. The method of claim 1, wherein the housing comprises a rifle stock.

21. The method of claim 1, wherein the activation module comprises a trigger.

22. The method of claim 1, wherein the activation module comprises a safety.

23. The method of claim 1, wherein the power source comprises a battery.

24. The method of claim 1, wherein the driving circuit is adapted to deliver the electrical energy to the laser device in pulses.

25. A method of using a laser dazzling apparatus comprising:
   providing a laser dazzling apparatus comprising:
   a laser device, the laser device including a green laser diode, the green laser diode comprising an active region and a cavity member, the green laser diode being configured to emit a laser beam at an intensity level of less than 800 mW, the active region including gallium nitride material, the laser beam being characterized by a first direction;
   a driving circuit electrically coupled to the laser device, the driving circuit being adapted to deliver electrical energy to the laser device, the electrical energy being less than 800 mW;
   a power source electrically coupled to the driving circuit;
   an activation module electrically coupled to the driving circuit, the activation module being configured to send an activation signal to the driving circuit, the activation module comprising an electrical trigger; and
   a sight for aligning the laser beam to a desired position; and directing the laser beam at a target.

26. The method of claim 25, wherein the laser device comprises a plurality of green laser diodes.

27. The method of claim 25, wherein the green laser diode is non-polar.

28. The method of claim 25, wherein the green laser diode is polar.

29. The method of claim 25, further comprising a housing member, wherein the laser device is arranged in the housing member and the housing member is mounted on a tripod.

* * * * *